US012107008B2

(12) United States Patent
Seo et al.

(10) Patent No.: US 12,107,008 B2
(45) Date of Patent: Oct. 1, 2024

(54) MASKLESS ALIGNMENT SCHEME FOR BEOL MEMORY ARRAY MANUFACTURING

(71) Applicant: International Business Machines Corporation, Armonk, NY (US)

(72) Inventors: Soon-Cheon Seo, Glenmont, NY (US); Dexin Kong, Redmond, WA (US); Muthumanickam Sankarapandian, Niskayuna, NY (US); Raghuveer Reddy Patlolla, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 17/523,086

(22) Filed: Nov. 10, 2021

(65) Prior Publication Data

US 2023/0145961 A1 May 11, 2023

(51) Int. Cl.
*H01L 21/768* (2006.01)
*H01L 23/522* (2006.01)
*H01L 23/544* (2006.01)

(52) U.S. Cl.
CPC .... *H01L 21/76897* (2013.01); *H01L 23/5226* (2013.01); *H01L 23/544* (2013.01); *H01L 2223/54426* (2013.01)

(58) Field of Classification Search
CPC .......... H01L 21/76897; H01L 23/5226; H01L 23/544; H01L 2223/54426
USPC ....................................................... 257/758
See application file for complete search history.

(56) References Cited

U.S. PATENT DOCUMENTS

| 6,891,277 | B2 | 5/2005 | Inomata |
| 7,825,000 | B2 | 11/2010 | Kanakasabapathy et al. |
| 8,609,441 | B2 | 12/2013 | Van Haren et al. |
| 9,553,129 | B2 | 1/2017 | Jiang et al. |
| 9,864,134 | B2 * | 1/2018 | Czornomaz ............ H01L 27/14 |
| 10,461,247 | B2 | 10/2019 | Shum et al. |

(Continued)

FOREIGN PATENT DOCUMENTS

| CN | 111312894 A | 6/2020 |
| CN | 111668369 A | 9/2020 |
| JP | 2006019738 A | 1/2006 |

*Primary Examiner* — Tu-Tu V Ho
(74) *Attorney, Agent, or Firm* — Scully, Scott, Murphy & Presser, P.C.; L. Jeffrey Kelly

(57) ABSTRACT

A method of manufacturing a semiconducting device that includes forming first opening for forming bottom electrode hole in a first area of a semiconductor wafer; forming a deeper second opening for overlay/alignment hole in second area; depositing a bottom electrode metal layer filling the first opening to form a bottom electrode and partially filling the second opening. A layer of sacrificial material is then deposited above the bottom electrode layer and completely filling the second opening. A chemical-mechanical planarization process is performed to remove the -bottom electrode metal and -sacrificial layer, the -sacrificial material layer being removed above a surface defined atop the filled remaining portion above the second opening. The sacrificial layer material is removed in the remaining portion of the second opening. The second opening providing an overlay/alignment feature topography detectable for alignment by lithography and for overlay measurement on the overlay metrology tool.

20 Claims, 13 Drawing Sheets

(56) References Cited

U.S. PATENT DOCUMENTS 10,658,575 B2     5/2020    Nagel
10,847,574 B2    11/2020    Wang et al.

\* cited by examiner

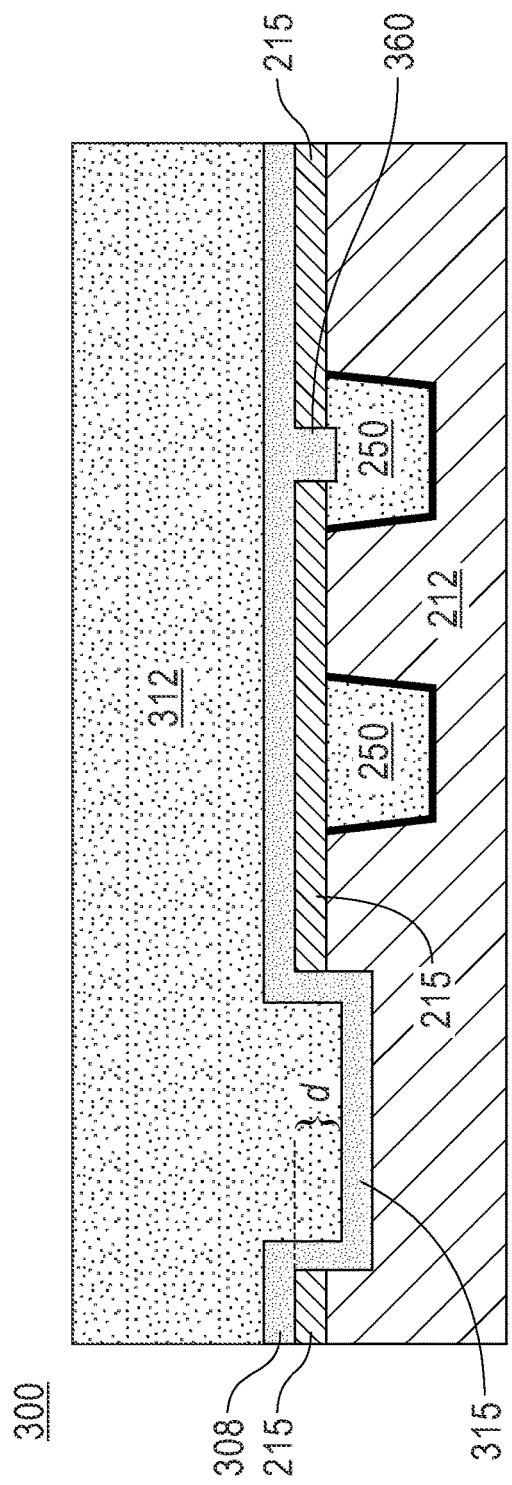
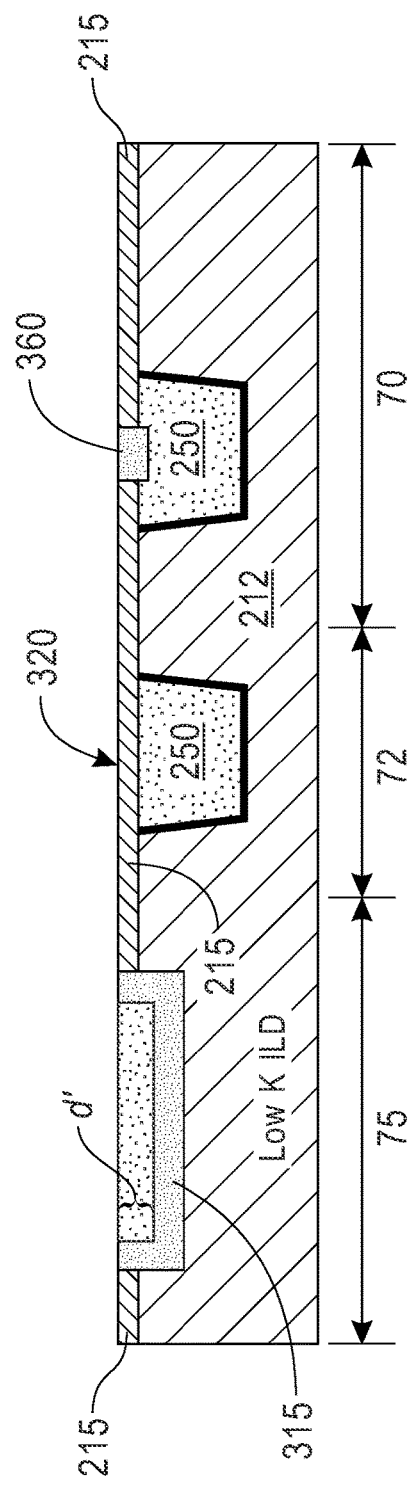

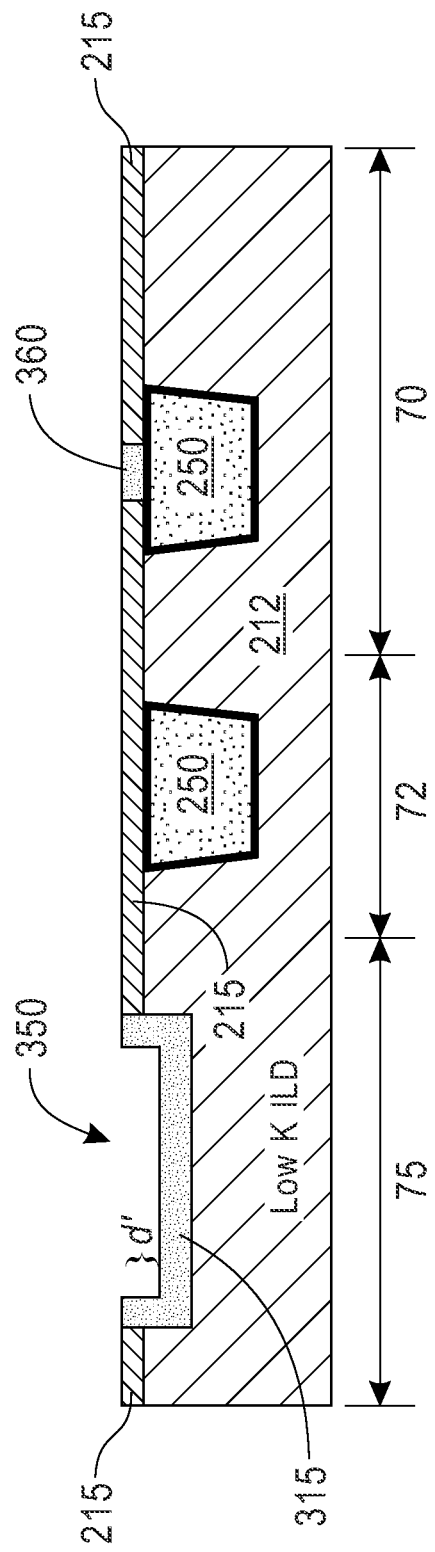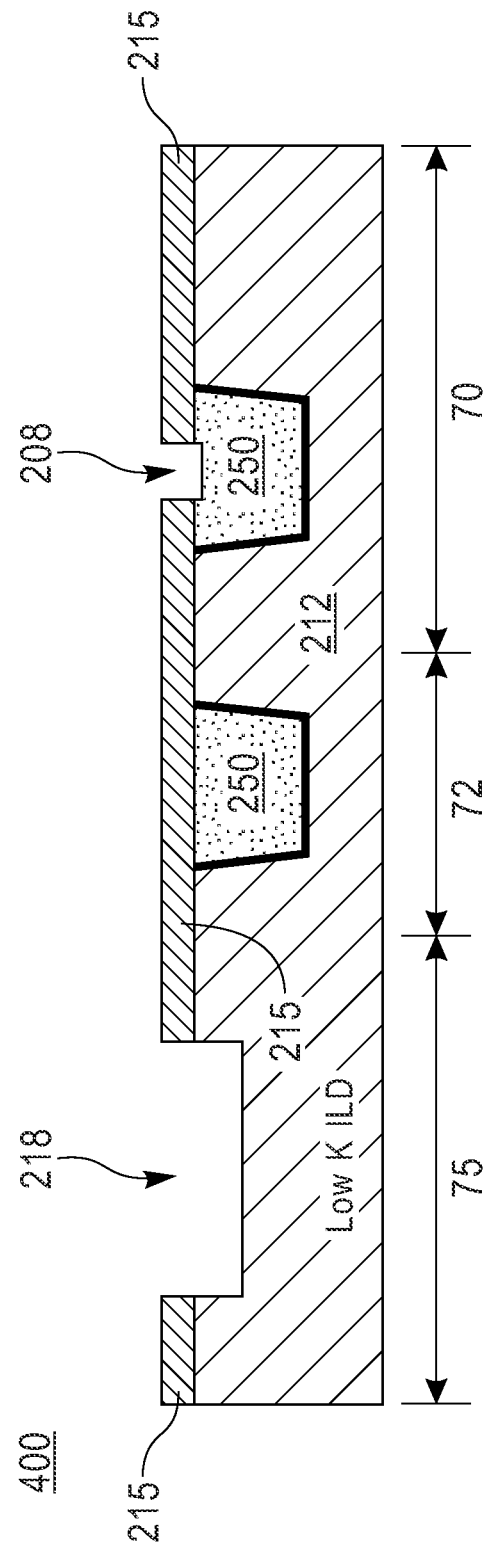

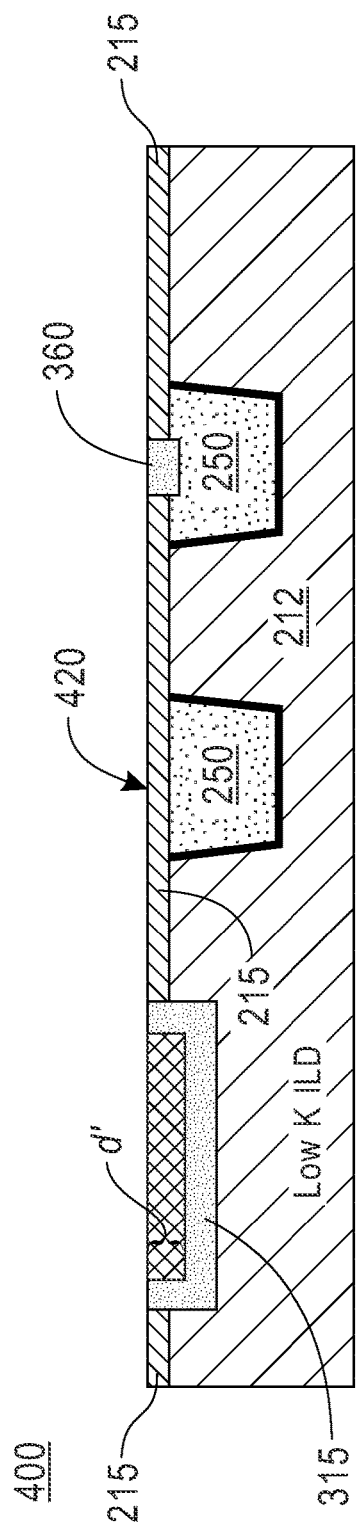
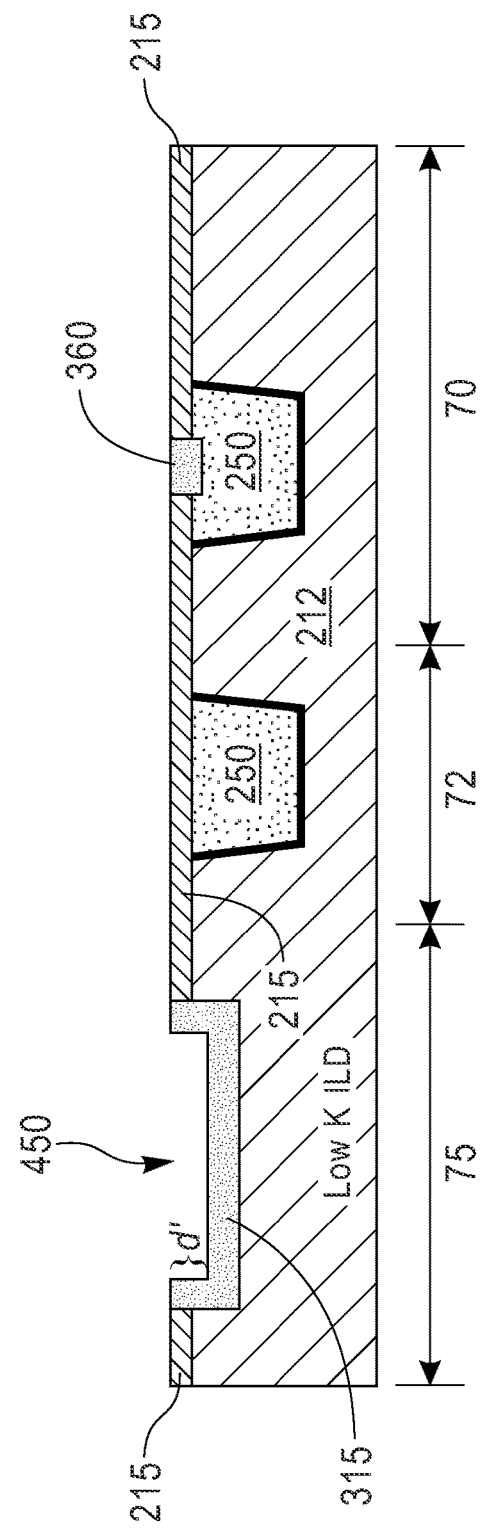
FIG. 5D
FIG. 5E

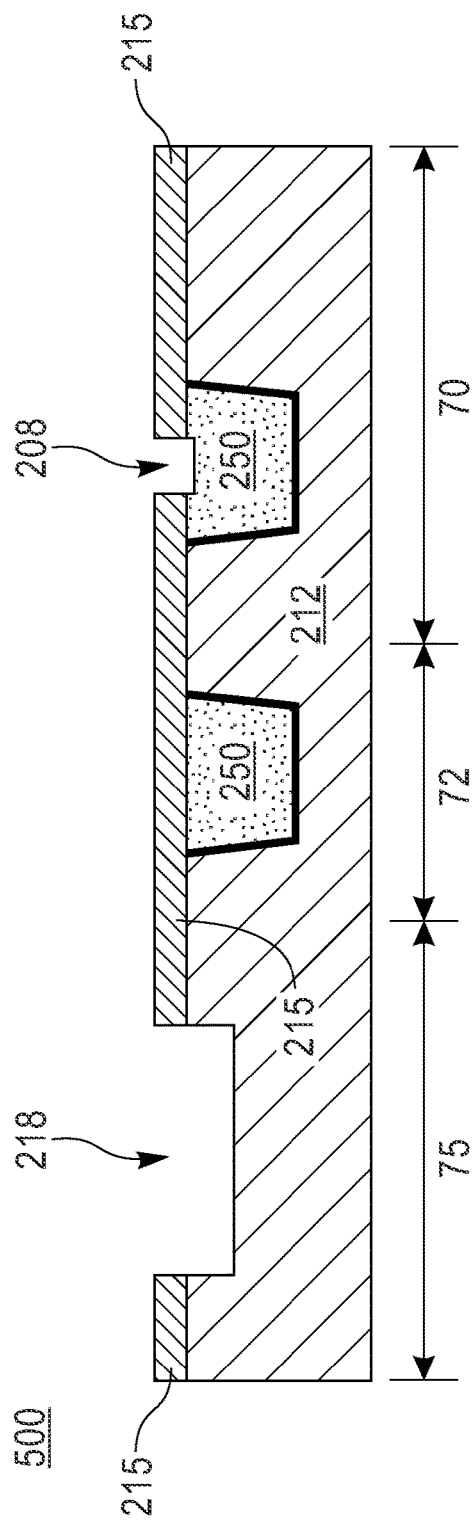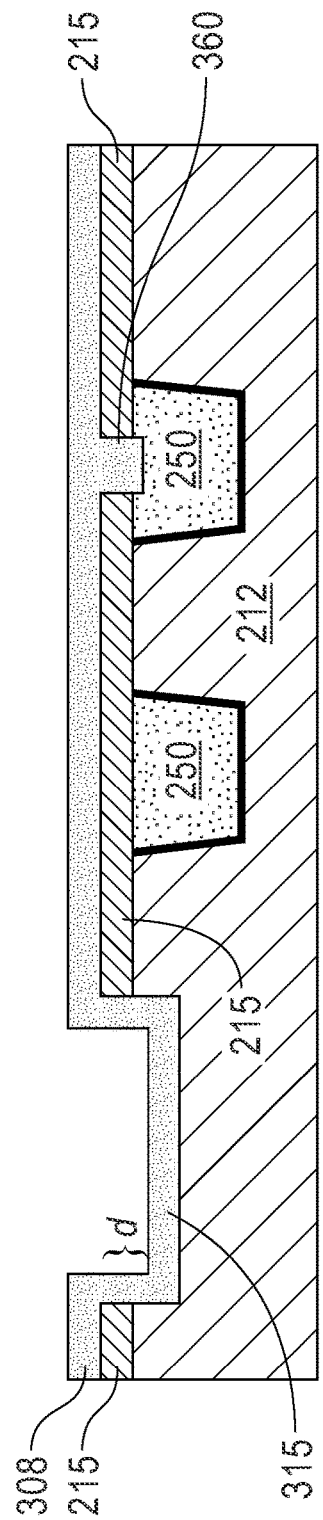

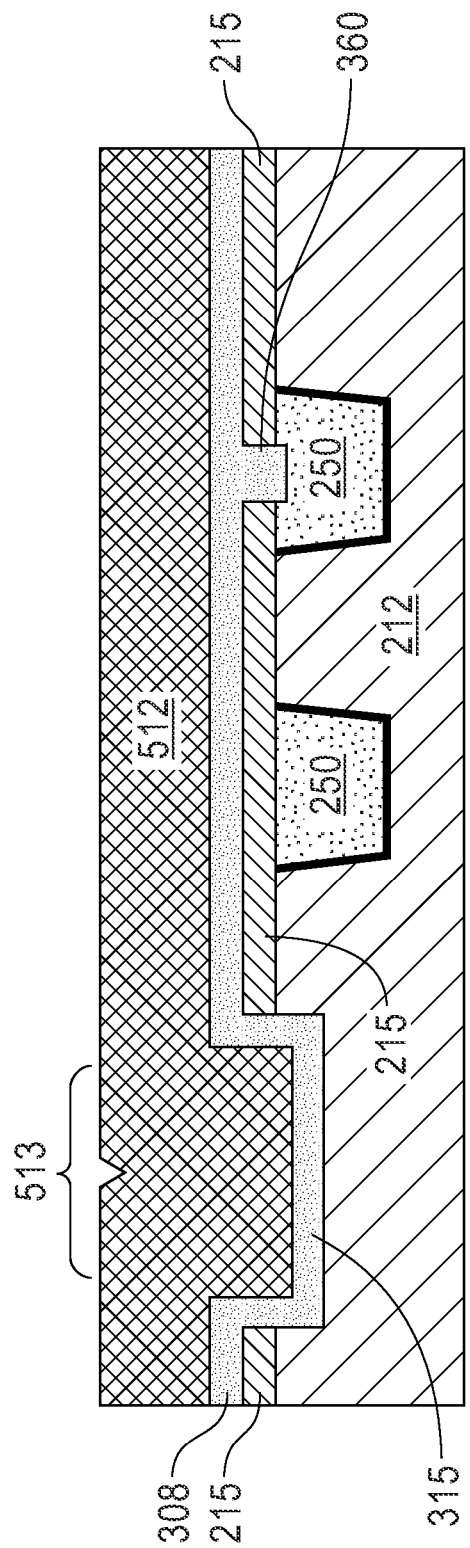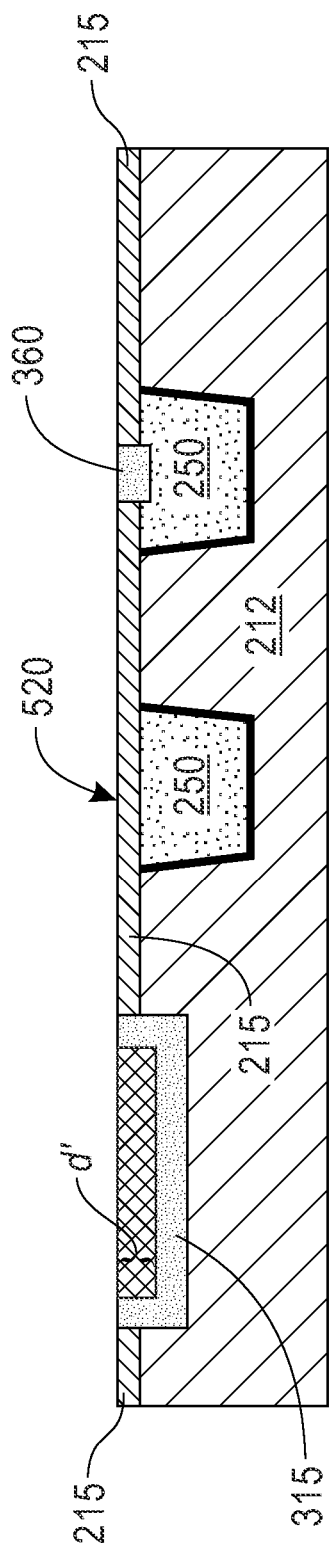

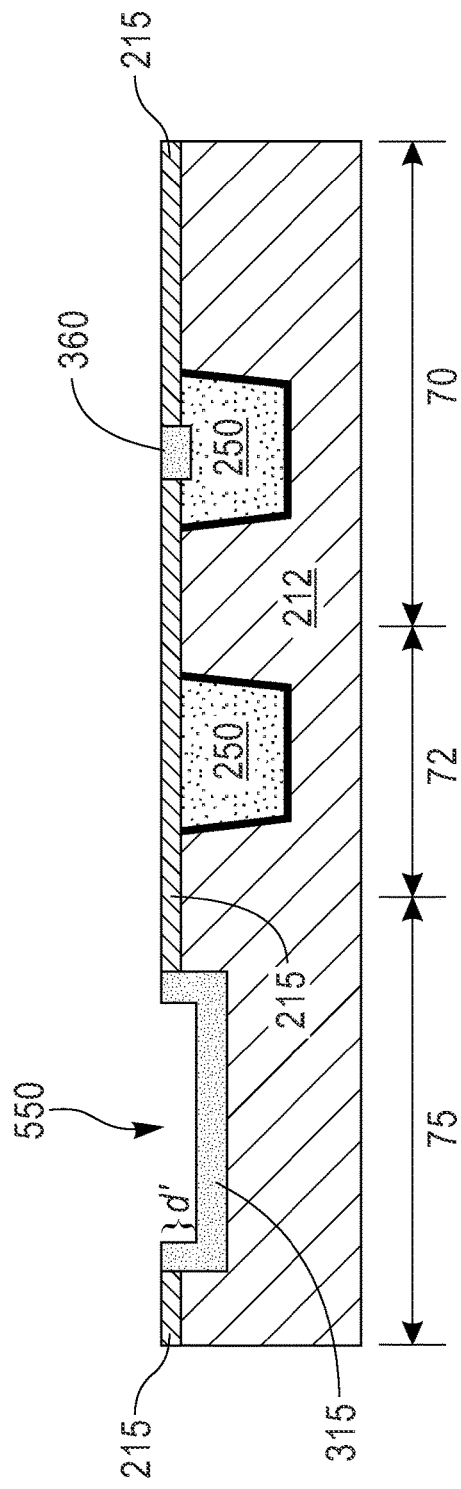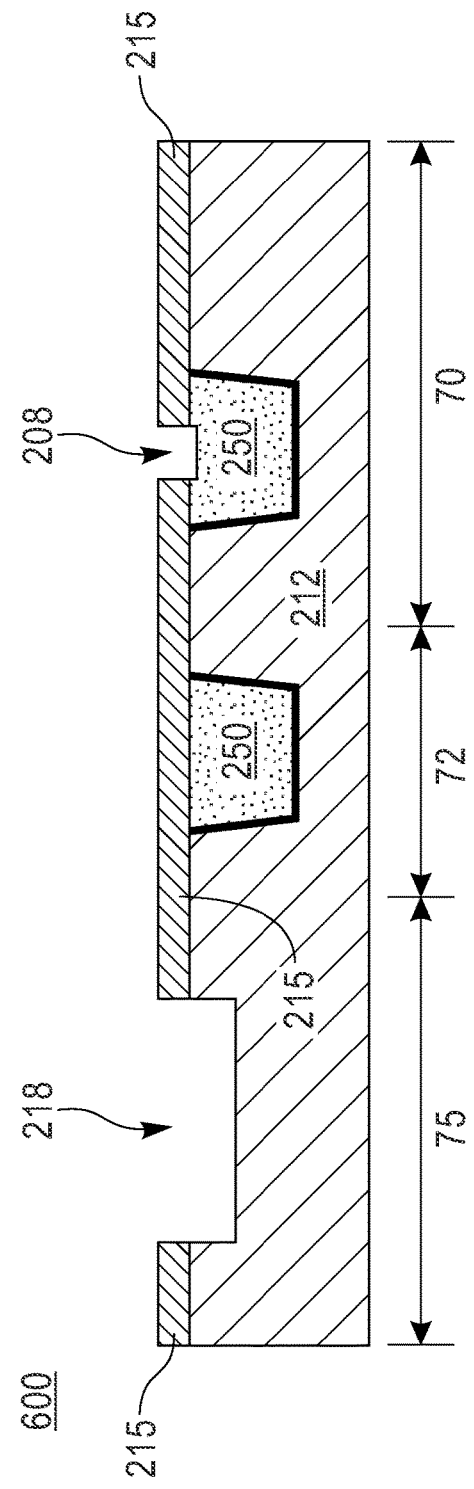

MASKLESS ALIGNMENT SCHEME FOR BEOL MEMORY ARRAY MANUFACTURING

BACKGROUND

The present disclosure generally relates to semiconductor manufacturing processes, and more particularly, a maskless lithography alignment technique for creating an alignment topography in a wafer kerf region.

Back-end-of-Line (BEOL) semiconductor manufacturing processes are implemented to manufacture conductive wires and electrodes which consist of multiple thick metal structures formed in one or more dielectric layers. FIG. 1 shows a cross-section view of an intermediate semiconductor structure 10 resulting from BEOL manufacturing processes in which the structure includes a stack including, in successive layers: a bottom interlevel low-k dielectric (ILD) or Tetraethyl orthosilicate (TEOS) material layer 12 having a surface over which is formed a thin Cu diffusion barrier or cap layer 215, e.g., a dielectric material such as SiN, SiCHN, or combinations thereof, an overlying top memory layer 20, an overlying cap layer 25 (e.g., SiN material), an organic planarization layer (OPL) 30, a patterning hardmask layer 35 and an overlying photoresist layer 40 used to pattern features. Formed in a memory device region 70 are memory elements, each including a stack (not shown) of various material layers. A memory element is connected to a respective conductor line or wire, e.g., landing pads 50 that are filled with a metal material such as copper, tungsten, copper alloy, cobalt, or any suitable conducting metals and which are shown lined with a barrier layer, e.g., Ta, TaN, Ti, TiN or any suitable liner materials 52. Such conductive landing pad structures 50 can also be formed in a defined logic area 72 of the wafer. The BEOL processing at the memory region 70 further includes the forming of a bottom electrode 60 connecting the landing pad 50 to a top memory layer 20. This top memory layer can contain RRAM (resistive random access memory), PCM (phase change memory), MRAM (magnetic random access memory), or any NVM (non volatile memory) stacks whose top electrode is composed of a metal or metal alloy material such as TaN, Ta, TiN, W.

At the time of forming bottom electrode 60, there are additionally overlay or alignment marks 80 for lithography process formed in Kerf region 75 (typically outside of chiplets). Typically, the depth of overlay/alignment mark 80 is deeper than that of bottom electrode 60 which is patterned over landing pad 50. The landing pad 50 acts as an etch stop and blocks further patterning into landing pad 50 while overlay/alignment mark 80 is etched deeper into ILD 12. Overlay/alignment mark 80 can be composed of a trench filled with the same metal or metal alloy material as the bottom electrode. Alignment mark 80 is used to assist the alignment of lithography process when forming memory stacks in the memory region 70, i.e., assist alignment of the new lithography layer with respect to the prior level patterns by adjusting both the wafer stage position and the reticle stage position of the lithography tool. Overlay mark 80 is additionally used to measure overlay shift between prior level and new lithographic level overlay marks after the new lithography process is done. The overlay measurement will then be feed back to next lithography to improve the next lithography alignment.

It is the case that, due to the presence of thick top memory layer 20, this memory stack is not transparent to lithographic tools to align or measure overlay to the prior level. For example, top memory layer containing TiN or TaN 20 greater than 50 nm thick will prevent viewing of the alignment mark 80 feature by the lithographic scan tools and overlay mark 80 by overlay measurement tool.

Further, if alignment and overlay marks 80 are distorted with prior level defects, they can cause alignment/overlay error and result in poor device yield. Defects trapped in these marks are not desired as they can cause contamination in downstream process tools.

Current efforts to overcome this problem is to create a topography around the overlay/alignment mark feature or inside of these marks that can be detected or viewed by the lithographic scan tools. That is, a topographical feature is formed at a prior level overlay and alignment marks only in Kerf area with an extra lithography and etching process before depositing the thick top memory layers. This method requires extra lithography mask which is designed to open only certain overlay/alignment marks in Kerf area while all other areas are all blocked and protected from this process. For example, from the intermediate structure of the cross-sectional view of FIG. 2A showing ILD layer 12 and overlying diffusion barrier layer 215, to create this topography, there is first performed depositing a mask layer 105 (e.g., photoresist or OPL) and etching a large opening 108 with a lithography process or lithography followed by etching process that exposes an area around the surface of the overlay/alignment mark 80 as shown in FIG. 2B. There are two ways of creating topography of prior level overlay/alignment mark 80. The first method illustrated in FIG. 2C is etching ILD around overlay/alignment mark 80. The second method illustrated in FIG. 3 is removing overlay/alignment mark itself 80.

As shown in FIG. 2C, further mask patterning and etching steps are performed to create the topography around the overlay/alignment mark. In an embodiment, the created topography includes a trench 110 formed at either side of the overlay/alignment mark feature 80, each trench 110 extending into the interlevel dielectric material layer below a lower surface of the overlay/alignment feature 80. The subsequent top memory stack material 120 will be deposited within the trenches and underfill to create the topography (>30 nm) that can be detected or viewed in subsequent steps by the lithographic tool.

FIG. 3 illustrates the second method. The depth of overlay/alignment mark trench 118 is deeper than that of bottom electrode 60 which is patterned over landing pad. If the depth of overlay/alignment mark is deeper than 30 nm, then topography is created by removing overlay/alignment material. The subsequent top memory stack material 120 will be deposited within the trenches and underfill to create the topography (>30 nm) that can be detected or viewed in subsequent steps by the lithographic tool.

The solution depicted in FIGS. 2A-2C and FIG. 3 requires use of extra lithography mask to pattern OPL or resist stack and additional etching steps to transfer the pattern into ILD 12 or removing the metal which increases the process cost.

SUMMARY

The present disclosure is directed to a maskless alignment scheme for BEOL memory array manufacturing without defects.

The maskless alignment scheme implements method steps that skip the additional lithographic and etching steps and utilizes incoming topography without trapping CMP slurry particles.

In one embodiment, the method includes depositing a thin bottom electrode and additional sacrificial material.

According to one aspect of the present disclosure, there is provided a method of manufacturing a semiconducting device. The method comprises: providing a first opening in a first area of a semiconductor wafer, the first opening corresponding to an electrode feature to be formed; providing a second opening in a second area of the semiconductor wafer, the second opening corresponding to an alignment mark feature to be formed which is deeper than the first opening; depositing a metal containing material layer for filling the first opening to form the electrode and the metal containing material layer partially filling the second opening; depositing a sacrificial material layer above the metal containing material layer, the sacrificial material layer completely filling an unfilled remaining portion of the second opening and extending above the second opening; removing the sacrificial material layer and said metal containing material layer above and between said first opening and second opening, the sacrificial material layer and metal containing material layers remaining in the second opening; removing the sacrificial material layer in the remaining portion of the second opening, the partially filled second opening providing an alignment feature topography.

According to a further aspect of the present disclosure, there is provided a semiconductor structure. The semiconductor structure comprises: an interlevel dielectric (ILD) material substrate; a metal conductor wire in the ILD material substrate having a top surface co-planar with a top surface of the ILD layer; a diffusion barrier layer above the top surface of the ILD material substrate and the metal conductor wire top surface; an electrode comprising a metal containing material formed above and electrically connected to the metal conductor wire top surface; a trench opening extending through the diffusion barrier layer and extending into the ILD material substrate, the trench opening having sidewall and bottom surfaces and having a liner of the metal containing material lining the sidewall and bottom surfaces, wherein the trench opening lined with the metal containing material layer provides an alignment feature topography without any trapped CMP slurry particles.

According to a further aspect, there is provided: a method of manufacturing a semiconducting structure. The method comprises: providing an interlevel dielectric (ILD) material substrate, the ILD material substrate including a metal conductor wire having a top surface co-planar with a top surface of the ILD material substrate; depositing a diffusion barrier layer above the top surface of the ILD material substrate and the metal conductor wire top surface; forming first trench opening through the diffusion barrier layer to expose the top surface of the metal conductor wire; forming a second trench opening through the diffusion barrier layer, the second trench opening extending into the ILD material substrate; depositing a layer of metal containing material above the diffusion barrier layer, the metal containing material for filling the first trench opening to form an electrode contacting the metal conductor wire top surface, the metal containing material lining sidewall surfaces and bottom surface of the second trench opening; depositing a sacrificial material layer above the metal containing material layer, the sacrificial material layer completely filling an unfilled remaining portion of the second opening and extending above the second opening; removing the sacrificial material layer and the metal containing material layer above and between the first trench opening and second opening, the sacrificial material layer and metal containing material layers remaining in the second opening; and removing the sacrificial material layer in the remaining portion of the second opening, the partially filled second opening providing an alignment feature topography.

In another embodiment, a plasma etch can be used to remove the sacrificial material layer if there is no topography of sacrificial material layer over the second trench opening (overlay/alignment marks); then a CMP process is performed to remove metal containing layer above the first trench opening and second opening, the sacrificial material layer and metal containing material layers remaining in the second opening; and then removing the sacrificial material layer in the remaining portion of the second opening, the partially filled second opening providing an alignment feature topography.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIGS. 4A-4D depict a maskless alignment scheme for BEOL memory array manufacturing according to a first embodiment;

FIGS. 5A-5E depict a maskless alignment scheme for BEOL memory array manufacturing according to a second embodiment;

FIGS. 6A-6E depict a maskless alignment scheme for BEOL memory array manufacturing according to a third embodiment; and FIGS. 7A-7E depict a maskless alignment scheme for BEOL memory array manufacturing according to a fourth embodiment.

DETAILED DESCRIPTION

Figure 1:
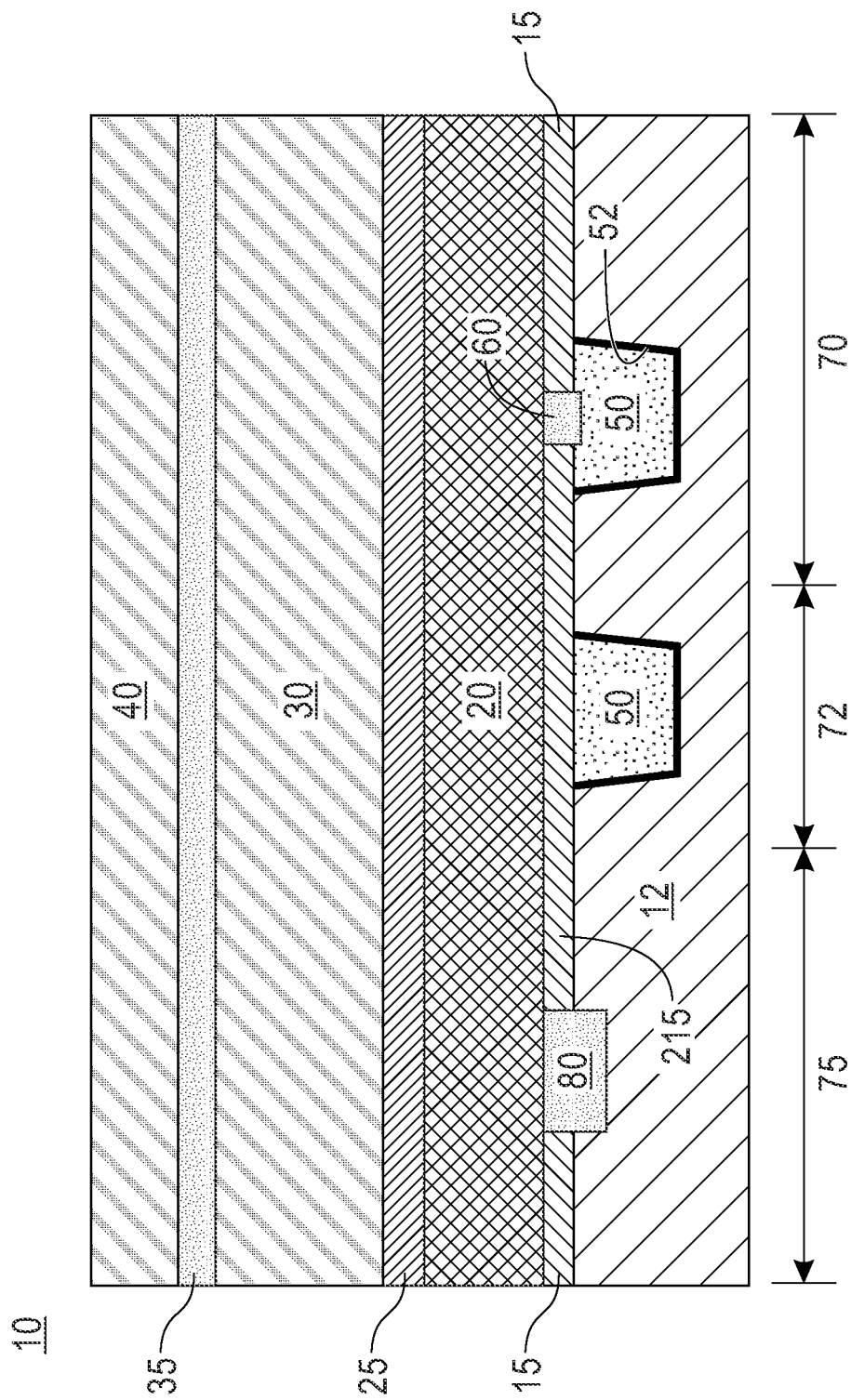
FIG. 1 shows a cross-section view of an intermediate semiconductor structure 10 resulting from BEOL manufacturing processes.
Figure 2A:
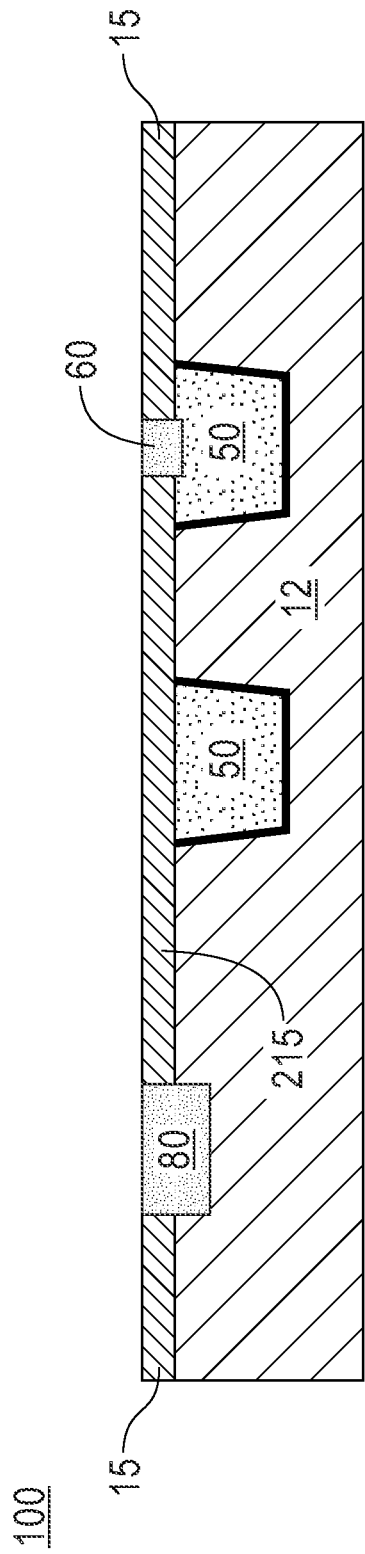
FIGS. 2A-2C and FIG. 3 show cross-sectional views of structures resulting from implementation of a prior art process for providing topography of an overlay/alignment mark to increase the alignment of lithography process.
Figure 2B:
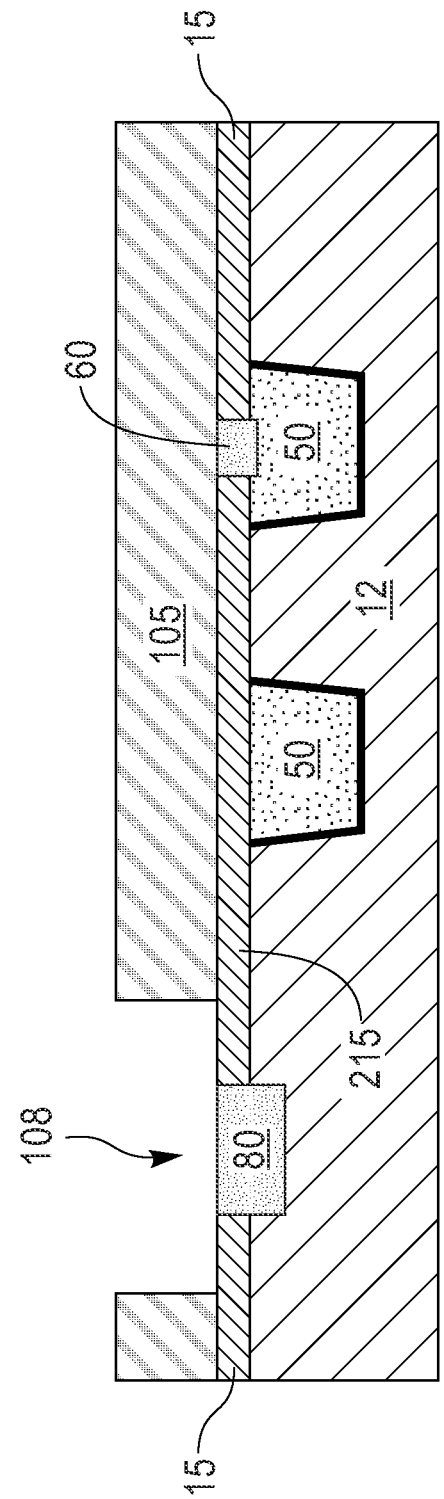
Figure 2C:
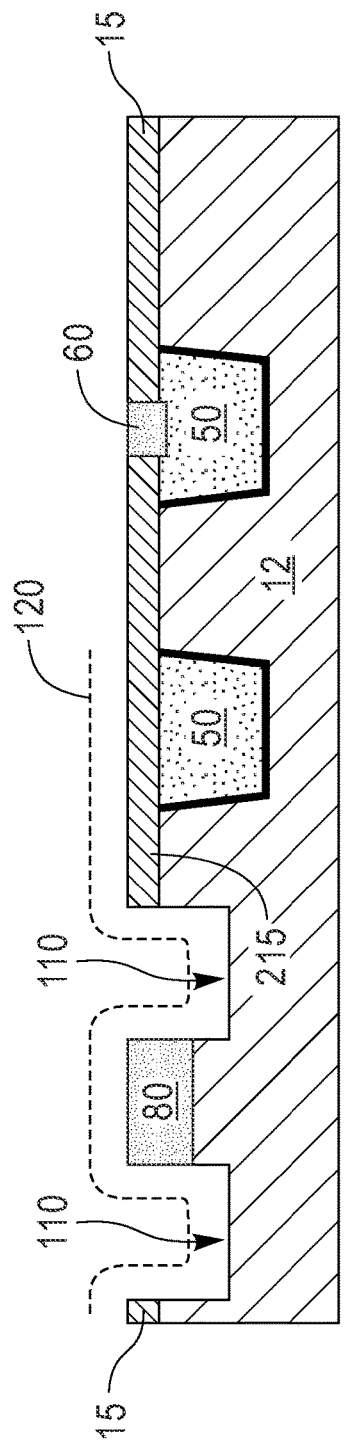
Figure 3:
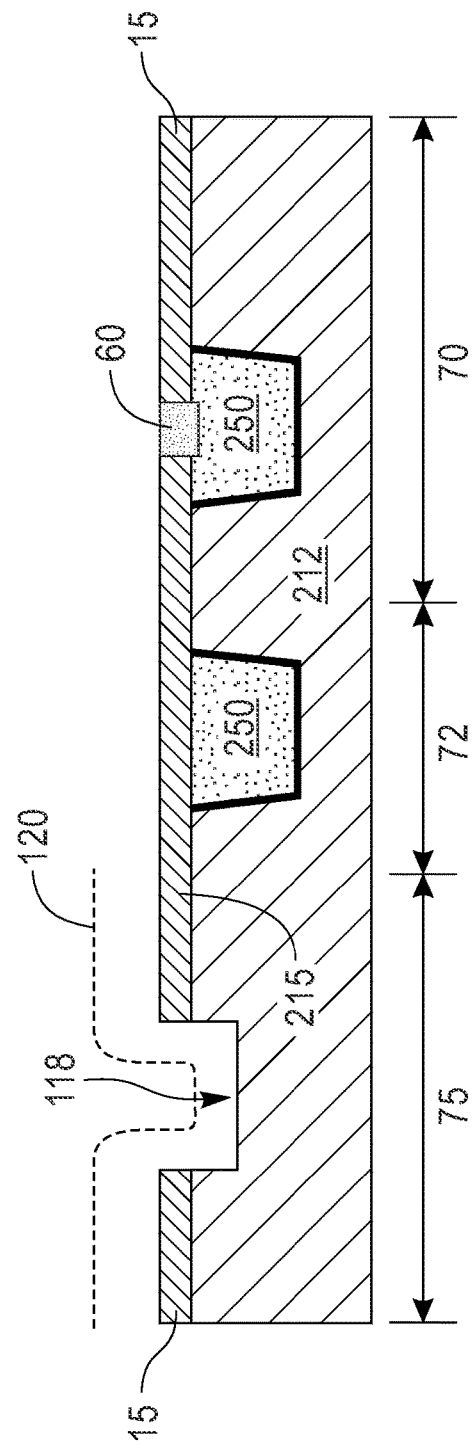

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

FIGS. 4A-4D depict a maskless alignment scheme for BEOL memory array manufacturing according to a first embodiment.

Figure 4A:
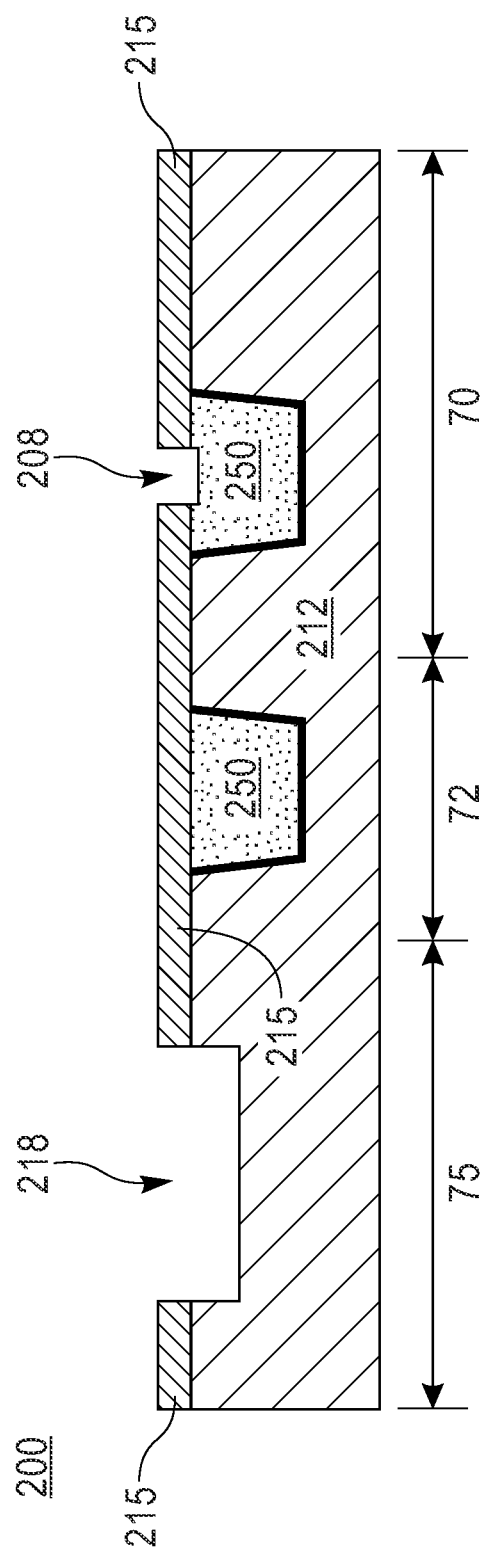

FIG. 4A depicts an initial structure 200 resulting from a bottom electrode patterning process that is used as a base structure for providing a maskless alignment scheme for BEOL memory array manufacturing. As shown in FIG. 4A, the initial structure includes an interlevel dielectric material level (ILD) 212 which may be composed of silicon dioxide, undoped silicate glass (USG), fluorosilicate glass (FSG), borophosphosilicate glass (BPSG), or a low-k dielectric layer containing Si, C, O, and H. The term "low-k" as used throughout the present application denotes a dielectric material that has a dielectric constant of less than 4.0; all dielectric constants are measured under vacuum unless otherwise stated herein). Within ILD layer 212 is formed, in respective memory region 70 and logic device region 72, a respective metal line or landing pad 250, composed of a deposited metal such as copper (Cu) or any other BEOL metal or metal alloy.

The top surface of the ILD and respective landing pads 250 is planarized and an overlying top dielectric barrier cap layer 215 is deposited above the surface. Dielectric cap layer 215 can be formed of a nitride dielectric which consists of Si, C, H, and N, e.g., SiN, SiCHN, or combinations thereof, with proper pretreatment to enhance adhesion to Cu. Dielectric cap layer 215 can have a varying thickness depending on the BEOL level. In embodiments, dielectric cap layer 215 can range in thickness from between 10 nm-200 nm.

For the initial structure 200, the bottom electrode patterning process includes lithographic mask patterning and etching processes to result in the forming of a first bottom electrode opening 208 in the dielectric cap layer to expose a top surface of landing pad 250 at the memory region 70 and the forming of a second opening or trench 218 through the cap layer 215 and through a portion of the ILD layer that can be used to form an overlay/alignment feature in the overlay/alignment or kerf region 75. In an embodiment, a dry etching process, such as an anisotropic etching process, for example, a reactive-ion etching (RIE) or any types of plasma etching, can be used, or a wet etching process can be used.

In an embodiment, the formed bottom electrode opening 208 is equal to or slightly deeper than the thickness of the cap layer 215. The incoming topography, i.e., the formed overlay/alignment feature trench opening 218 depth is deeper than the depth of trench 208. The incoming bottom electrode opening depth difference between memory region (land on the Cu landing pad) and kerf region 75 is determined by the final topography required (e.g., >35 nm) for lithography tool for alignment plus the thickness of bottom electrode metal layer plus the thickness amount that will be lost during CMP process. This depth difference is due to the unequal etch rates in the ILD vs. the etch rate through the SiN landing on the Cu. Typically, RIE etch creates this issue where there is no Cu underneath, i.e., the etch rate in ILD is much faster than that in SiN landing on Cu. The depth difference is determined by final depth (topography) achieved after removing sacrificial layer. Final depth topography needs to be greater than 35 nm for a lithography tool to detect prior level alignment marks. If subsequent processing removes about 15 nm of dielectric capping layer 215, e.g., by CMP, then the topography of overlay/alignment mark with bottom electrode partially filled in needs to be at least 50 nm. It means that the depth of trench opening 218 needs to be 50 nm plus the thickness of bottom electrode metal deposition.

FIGS. 4B-4D depict a maskless alignment scheme 300 for BEOL memory array manufacturing according to a first embodiment. Given the structure of FIG. 4A, FIG. 4B shows the resulting structure after depositing a bottom electrode metal layer 308 above the cap layer 215 and then forming an overlying sacrificial material layer, such as a Cu metal layer 312. In embodiments, the bottom electrode metal material layer 308 can include a material such as TaN, however other suitable bottom electrode metal that is resistant to sacrificial Cu removal process which will be used later. The bottom electrode metal material layer 308 can be deposited by, but not limited to, atomic layer deposition (ALD), chemical vapor deposition (CVD), or physical vapor deposition (PVD) processes. The Cu layer 312 can be formed by any suitable process or any suitable combination of multiple processes, including but not limited to, electroplating, electroless plating, atomic layer deposition (ALD), chemical vapor deposition (CVD), physical vapor deposition (PVD), etc.. For a typical BEOL metallization practice, thin PVD Cu seed deposition is followed by Cu electroplating to deposit thick layer is employed. In an embodiment, the thickness of the deposited bottom electrode metal material layer 308 needs to be at least as thick as 1.2 times of the depth of 208 in order to accommodate CMP process without an underfill issue. For example, if the depth of 208 is 60 nm, then the thickness of bottom electrode metal material layer 308 needs to be at least thicker than 72 nm in order to completely fill the hole of 208 and have some amount of overburden covering the hole. CMP will remove overburden and some amount of cap layer. The thickness of the deposited sacrificial Cu material layer 312 needs to be a thickness of about 1.2 times of the depth of 218 in order to avoid underfill issue after CMP. Thus, while depositing the bottom electrode metal material layer 308 completely fills the first opening 208 to form the bottom electrode 360, however, the second overly/alignment trench opening 218 in the kerf region is only partially filled with the bottom electrode metal material 315 that conforms to the inner surfaces of the trench. The initial depth of trench opening 315 from the top of dielectric cap 215 to the bottom of trench gets reduced by thickness of bottom electrode 308 deposition. In an embodiment, if the depth of bottom electrode hole 208 is 60 nm and the thickness of the bottom electrode metal is 75 nm, then the trench depth is reduced by 75 nm in overlay/alignment mark trench. If thickness loss of dielectric cap during CMP is about 15 nm, the depth "d" from top of dielectric cap 215 to top of bottom electrode in trench 315 should be about 50 nm. Therefore, the initial depth of overlay/alignment mark trench 218 needs to be greater than 125 nm (i.e., a 125 nm initial depth of trench opening 218 which approximately equals a 35 nm final topography +75 nm bottom metal thickness +15 nm dielectric cap loss by CMP).

As shown in the cross-sectional view of FIG. 4C, there is depicted a resulting structure formed after performing a further CMP step to remove the Cu layer 312 and the bottom electrode metal material layer 308 (e.g., TaN layer) in the field areas and planarize the surface 320. In the kerf region 75, the resulting structure includes a bottom metal nitride layer 315, e.g., and a copper filling that is of a depth "d" within the second opening. In an embodiment, the remaining depth d' within second opening is approximately 35 nm deep. Thus, it is the case that the performed CMP results in a thickness loss of SiN layer of about 15 nm. As an example of this process, it is assumed an initial thickness of the SiN cap layer 215 is about 60 nm. The thickness of initial the SiN cap layer can vary depending on SiN loss during CMP. It is understood that any standard Cu and barrier liner slurries can be used which can be based on, but not limited to, Ceria, Alumina, colloidal silica and so on.

If a sacrificial layer is not deposited and a CMP process performed to remove metal containing bottom electrode material 308, CMP slurry particles can get trapped inside the underfilled second opening which would cause defects in alignment marks which are not usable and also result in contamination to downstream process tools.

FIG. 4D shows resulting structure after removing Cu material while the bottom electrode metal material layer 308 (TaN material) portion 315 is intact within the second opening in the kerf region 75. This leaves a topography of about a depth d' for use as the overlay/alignment mark feature 350 in the kerf 75. Examples of wet chemistries used for the copper etch can include, but not limited to, hydrogen peroxides mixed with Hydrochloric acid, Phosphoric acid or Citric acid, etc.

Figure 5B:
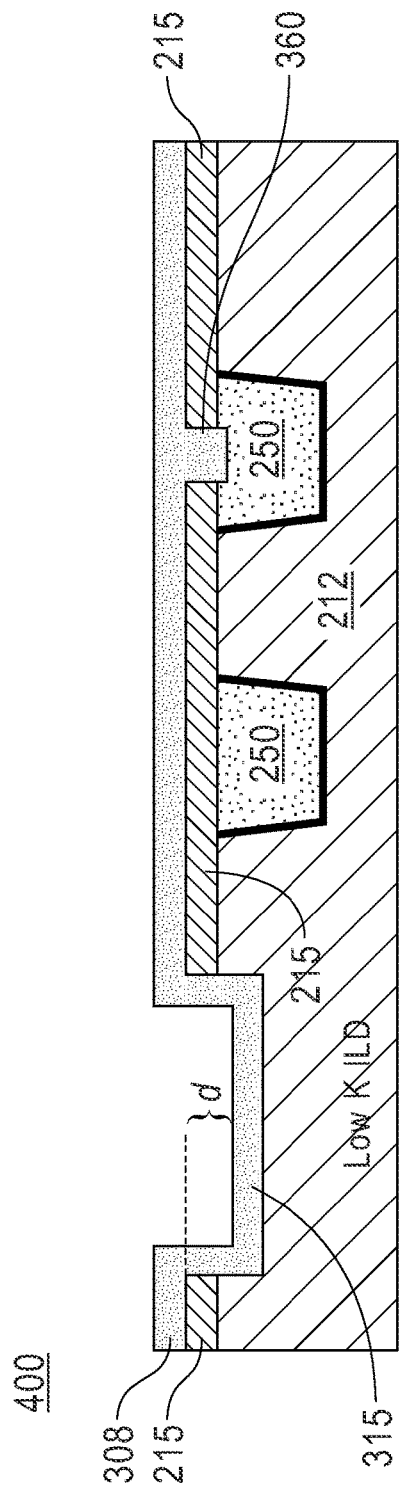

FIGS. 5A-5E depict a maskless alignment scheme 400 for BEOL memory array manufacturing according to a second embodiment. FIG. 5A depicts an initial structure such as the structure depicted in FIG. 4A resulting from a bottom electrode patterning process. As shown in FIG. 5A, the initial structure includes the interlevel dielectric material level 212 within which is formed, in respective memory region 70 and logic device region 72, a respective metal line or landing pad 250, e.g., including a deposited BEOL metal, e.g., Cu, or metal alloy. The surface of the ILD and respective landing pads 250 is planarized and an overlying top dielectric diffusion barrier cap layer 215 is deposited above the surface. The bottom electrode patterning process includes lithographic mask patterning and etching processes to result in the forming of a first bottom electrode opening 208 in the dielectric cap layer exposing a top surface of landing pad 250 at the memory region 70 and the forming of a second opening or trench 218 through the cap layer 215 and through a portion of the ILD layer that can be used to form an overlay/alignment feature in the overlay/alignment or kerf region 75.

FIG. 5B shows the resulting structure after depositing the bottom electrode metal layer 308 above the cap layer 215. In embodiments, the bottom electrode metal material layer 308 can include TaN or any suitable bottom electrode metal which is resistant to a subsequently implemented TiN removal process. The bottom electrode metal deposition can be performed using PVD, CVD, and ALD. In an embodiment, the thickness of the deposited bottom electrode metal material layer 308 needs to be at least 1.2 times thicker than the depth of 360 to accommodate CMP process. For example, if the depth of 360 is 60 nm, then the thickness of layer 308 is >72 nm.

The deposited bottom electrode metal material layer 308 completely fills the first opening 208 to form the bottom electrode 360, however, the second overly/alignment trench opening 218 in the kerf region is only partially filled with the bottom electrode metal material 315 that conforms to the inner surfaces of the trench. The initial depth of trench opening 315 from the top of dielectric cap 215 to the bottom of trench gets reduced by thickness of bottom electrode 308 deposition. In an embodiment, if the depth of bottom electrode hole 208 is 60 nm and the thickness of the bottom electrode metal is 75 nm, then the trench depth is reduced by 75 nm in overlay/alignment mark trench. If thickness loss of dielectric cap during CMP is about 15 nm, the depth "d" from top of dielectric cap 215 to top of bottom electrode in trench 315 should be about 50 nm. Therefore, the initial depth of overlay/alignment mark trench 218 needs to be >125 nm (i.e., a 125 nm initial depth of trench opening 218 which approximately equals a 35 nm final topography +75 nm bottom metal thickness +15 nm dielectric cap loss by CMP).

Figure 5C:
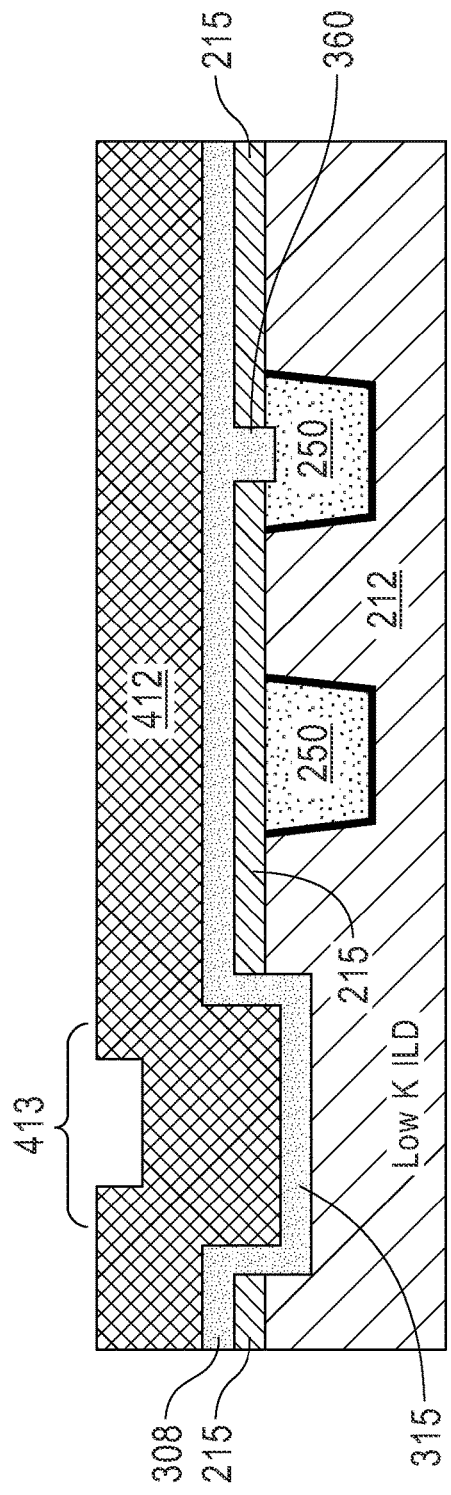

FIG. 5C shows a further resulting structure after depositing a sacrificial metal-nitride material layer 412 above the bottom electrode metal material layer 308 and portion 315. In an embodiment, the deposited sacrificial TiN. In an embodiment, this sacrificial TiN is deposited to a thickness of at least 1.2 times of the incoming topography so that there is no significant underfill in the trench opening 218. Example TiN layer deposition techniques can include but is not limited to, PVD or CVD processes. Since this is sacrificial layer, PVD is more cost effective process technique to deposit thick overburden layer. A topography 413 of the sacrificial material over the second opening results as depicted in FIG. 5C.

As shown in the cross-sectional view of FIG. 5D, there is depicted a resulting structure formed after performing a further CMP step to remove the sacrificial metal-nitride layer 412 (e.g., TiN layer) given its topography 413 and the TaN layer 308 in the field areas and planarize the surface 420. In the kerf region 75, the resulting structure includes a bottom metal nitride layer 315, e.g., and a sacrificial metal-nitride material filling that is of a depth "d'" within the second opening. In an embodiment, the remaining depth d' within second opening is approximately 35 nm deep. Thus, it is the case that the performed CMP results in a SiN layer 215 thickness loss of about 15 nm. As an example of this process, it is assumed an initial thickness of the SiN cap layer 215 is about 60 nm. In an embodiment, any standard barrier liner slurries can be used to polish thin metal films with, but not limited to, Silica, Alumina, and Ceria abrasives. If the sacrificial layer 412 is not deposited and a CMP process performed to remove metal containing bottom electrode material 308, CMP slurry particles can get trapped inside the underfilled second opening which would cause defects in alignment marks which are not usable and also result in contamination to downstream process tools.

FIG. 5E shows a resulting structure after employing a further wet etching process to remove only the sacrificial TiN material while the bottom electrode metal material layer 308 (e.g., TaN material) is intact within the second opening in the kerf region 75. This leaves a topography of about a depth d' for use as the overlay/alignment mark feature 450 in the kerf 75.

Examples of TiN wet removal chemistries that can be used include: Hydrogen peroxide by itself or mixed with bases or acids. Typical bases include but not limited to ammonium hydroxides, quarternary ammonium hydroxides such as tetramethylammonium hydroxide (TMAH), tetraethylammonium hydroxide (TEAH), etc. and acids include both inorganic and organic acids such as Hydrochloric acid, citric acid, etc.

FIGS. 6A-6E depict a maskless alignment scheme 500 for BEOL memory array manufacturing according to a third embodiment. FIG. 6A depicts an initial structure such as the structure depicted in FIG. 4A resulting from a bottom electrode patterning process. As shown in FIG. 6A, the initial structure includes an interlevel dielectric material level 212 within which is formed, in respective memory region 70 and logic device region 72, a respective metal line or landing pad 250 composed of a copper (Cu) or any other BEOL metal or metal alloy. The surface of the ILD and respective landing pads 250 is planarized and a top dielectric cap layer 215 is deposited over the surface. The bottom electrode patterning process includes lithographic mask patterning and etching processes to result in the forming of a first bottom electrode opening 208 in the dielectric cap layer exposing a top surface of landing pad 250 at the memory region 70 and the forming of a second opening or trench 218 through the cap layer 215 and through a portion of the ILD layer that can be used to form an overlay/alignment feature in the overlay/alignment or kerf region 75.

FIG. 6B shows the resulting structure after depositing the bottom electrode metal layer 308 above the cap layer 215. In embodiments, the bottom electrode metal material layer 308 can include materials such as TaN, TiN, W, Pt, Ru, Ni, W, etc., deposited by ALD, CVD or PVD processes. In an embodiment, the thickness of the deposited bottom electrode metal material layer 308 needs to be at least as thick as 1.2 times the depth of 208. For example, if the depth of 208 is 60 nm, then the thickness of bottom electrode metal material layer 308 needs to be at least thicker than 72 nm in order to completely fill the hole of trench 208 and have some amount of overburden covering the hole. CMP will remove overburden and some amount of cap layer.

The deposited bottom electrode metal material layer 308 completely fills the first opening 208 to form the bottom electrode 360, however, the second overly/alignment trench opening 218 in the kerf region is only partially filled with the bottom electrode metal material 315 that conforms to the inner surfaces of the trench. The initial depth of trench opening 315 from the top of dielectric cap 215 to the bottom of trench gets reduced by thickness of bottom electrode 308 deposition. In an embodiment, if the depth of bottom electrode hole 208 is 60 nm and the thickness of the bottom electrode metal is 75 nm, then the trench depth is reduced by 75 nm in overlay/alignment mark trench. If thickness loss of dielectric cap during CMP is about 15 nm, the depth "d" from top of dielectric cap 215 to top of bottom electrode in trench 315 should be about 50 nm. Therefore, the initial depth of overlay/alignment mark trench 218 needs to be 125 nm (i.e., a 125 nm initial depth of trench opening 218 which approximately equals a 35 nm final topography +75 nm bottom metal thickness +15 nm CMP loss).

FIG. 6C shows a further resulting structure after depositing a flowable oxide or flowable low-k dielectric material layer 512 above the bottom electrode metal material layer 308. In an embodiment, the flowable oxide or flowable low-k dielectric material layer 512 can include but not limited to a SiO2, SiCOH, and etc.. In one example, flowable low-k dielectric material layer can be a low-k material having a dielectric constant less than 4.0. In some embodiments, the flowable oxide or flowable low-k dielectric material layer can be formed by a deposition technique including, for example, chemical vapor deposition (CVD), although other deposition techniques can be used including, but not limited to: chemical vapor deposition, plasma enhanced chemical vapor deposition (PECVD), or spin-on-coating. In an embodiment, the flowable oxide or flowable low-k dielectric material layer 512 is deposited to a thickness of 1.2 times thicker than the incoming topography so that there is no significant underfill in the trench opening 218. A topography 513 of the flowable oxide or flowable low-k dielectric material layer over the second opening results as depicted in FIG. 6C.

As shown in the cross-sectional view of FIG. 6D, there is depicted a resulting structure formed after performing a further CMP step to remove the sacrificial flowable oxide or flowable low-k dielectric material layer 512 given its topography 513 and bottom electrode metal material layer 308 (e.g., TaN layer) in the field areas and planarize the surface 520. In the kerf region 75, the resulting structure includes a bottom metal nitride layer 315, e.g., and the sacrificial flowable oxide or flowable low-k dielectric material layer filling that is of a depth "d'" within the second opening. In an embodiment, the remaining depth d' within second opening is approximately 35 nm deep. Thus, it is the case that the performed CMP results in a thickness loss of about 15 nm of the SiN layer 215. As an example of this process, it is assumed an initial thickness of the SiN layer 215 is about 50 nm. In an embodiment, a CMP process removes flowable oxide or low-K and then remove bottom electrode metal using standard Silica or Ceria based slurries. If the sacrificial layer 512 is not deposited and a CMP process performed to remove metal containing bottom electrode material 308, CMP slurry particles can get trapped inside the underfilled second opening which would cause defects in alignment marks which are not usable and also result in contamination to downstream process tools.

FIG. 6E shows a resulting structure after employing a wet etching or dry etching process to remove the sacrificial flowable oxide or flowable low-k dielectric material while TaN portion 315 is intact within the second opening in the kerf region 75. Flowable oxide can be removed by DHF or a plasma etching for SiO2 removal without etching TaN. Flowable low-K etch can be removed by a plasma etching without etching TaN. This leaves a topography of about a depth d' for use as the overlay/alignment mark feature 550 in the kerf 75. The wet etch chemistries that can be used are as listed above.

Figure 7B:
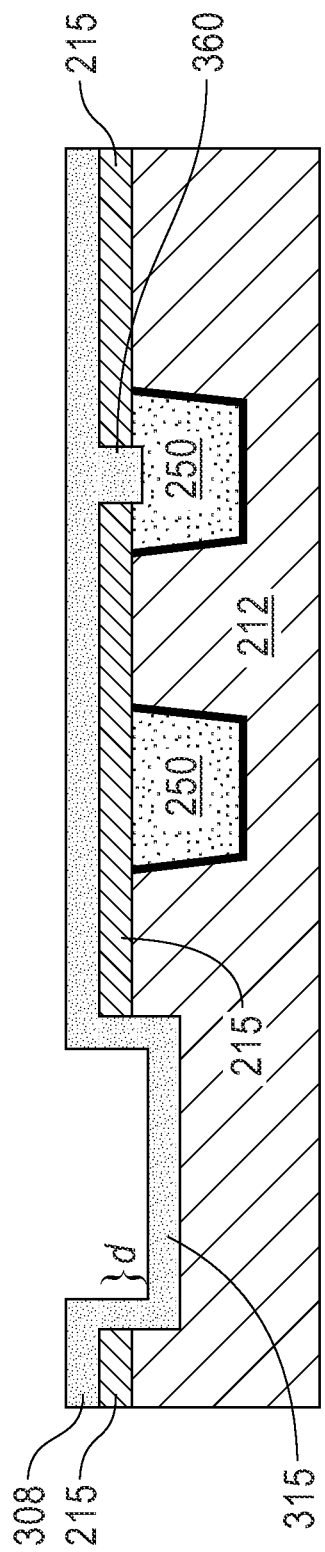

FIGS. 7A-7E depict a maskless alignment scheme 600 for BEOL memory array manufacturing according to a fourth embodiment. FIG. 7A depicts an initial structure such as the structure depicted in FIG. 4A resulting from a bottom electrode patterning process. As shown in FIG. 7A, the initial structure includes the interlevel dielectric material level 212 within which is formed, in respective memory region 70 and logic device region 72, a respective metal line or landing pad 250, e.g., including a deposited BEOL metal, e.g., Cu, or metal alloy. The surface of the ILD and respective landing pads 250 is planarized and an overlaying top dielectric diffusion barrier cap layer 215 is deposited above the surface. The bottom electrode patterning process includes lithographic mask patterning and etching processes to result in the forming of a first bottom electrode opening 208 in the dielectric cap layer exposing a top surface of landing pad 250 at the memory region 70 and the forming of a second opening or trench 218 through the cap layer 215 and through a portion of the ILD layer that can be used to form an overlay/alignment feature in the overlay/alignment or kerf region 75.

FIG. 7B shows the resulting structure after depositing the bottom electrode metal layer 308 above the cap layer 215. In embodiments, the bottom electrode metal material layer 308 can include TaN or any suitable bottom electrode metal which is resistant to OPL removal process. The bottom electrode metal deposition can be performed using PVD, CVD, and ALD. In an embodiment, the thickness of the deposited bottom electrode metal material layer 308 needs to be at least 1.2 times thicker than the depth of 360 to accommodate CMP process. For example, if the depth of 360 is 60 nm, then the thickness of layer 308 is >72 nm.

The deposited bottom electrode metal material layer 308 completely fills the first opening 208 to form the bottom electrode 360, however, the second overly/alignment trench opening 218 in the kerf region 75 is only partially filled with the bottom electrode metal material 315 that conforms to the inner surfaces of the trench. The initial depth of trench opening 315 from the top of dielectric cap 215 to the bottom of trench gets reduced by thickness of bottom electrode 308 deposition. In an embodiment, if the depth of bottom electrode hole 208 is 60 nm and the thickness of the bottom electrode metal is 75 nm, then the trench depth is reduced by 75 nm in overlay/alignment mark trench. If thickness loss of dielectric cap during CMP is about 15 nm, the depth "d" from top of dielectric cap 215 to top of bottom electrode in trench 315 should be about 50 nm. Therefore, the initial depth of overlay/alignment mark trench 218 needs to be 125 nm (i.e., a 125 nm initial depth of trench opening 218 which approximately equals a 35 nm final topography +75 nm bottom metal thickness +15 nm CMP loss).

Figure 7C:
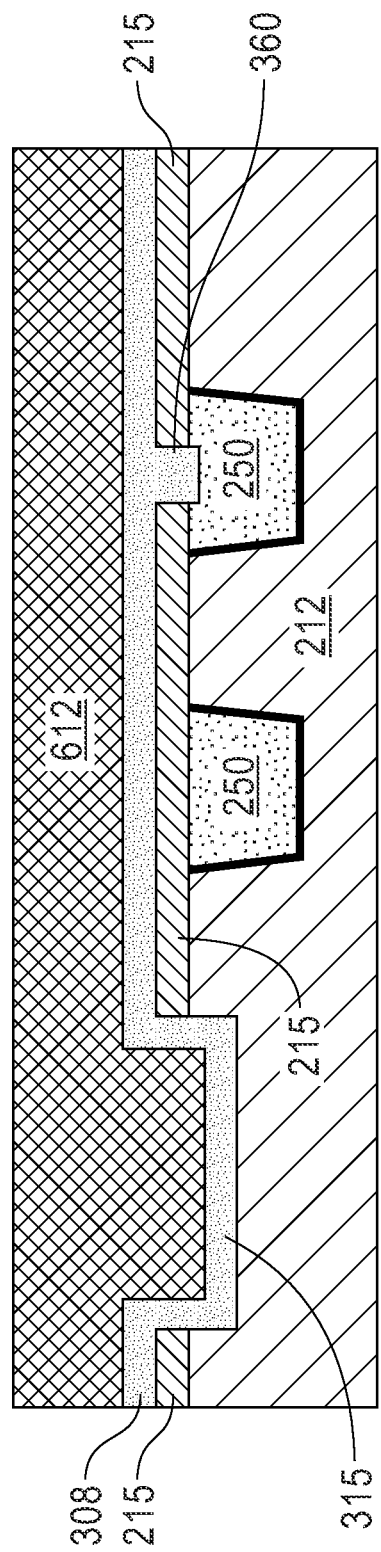

FIG. 7C shows a further resulting structure after depositing a sacrificial Organic Planarization Layer (OPL) layer 612 above the bottom electrode metal material layer 308 and portion 315. In an embodiment, the deposited sacrificial OPL layer 612 is a spin-on carbon material and is deposited to a thickness which is thicker than the incoming topography and thickness where it planarizes over the trench opening 218 without topography depending on viscosity of OPL material. OPL deposition utilizes spin coating process technique. OPL layer 6121 is deposited to form a level, i.e., a substantially flat top surface, without any topography over the surface of trench 315.

Figure 7D:
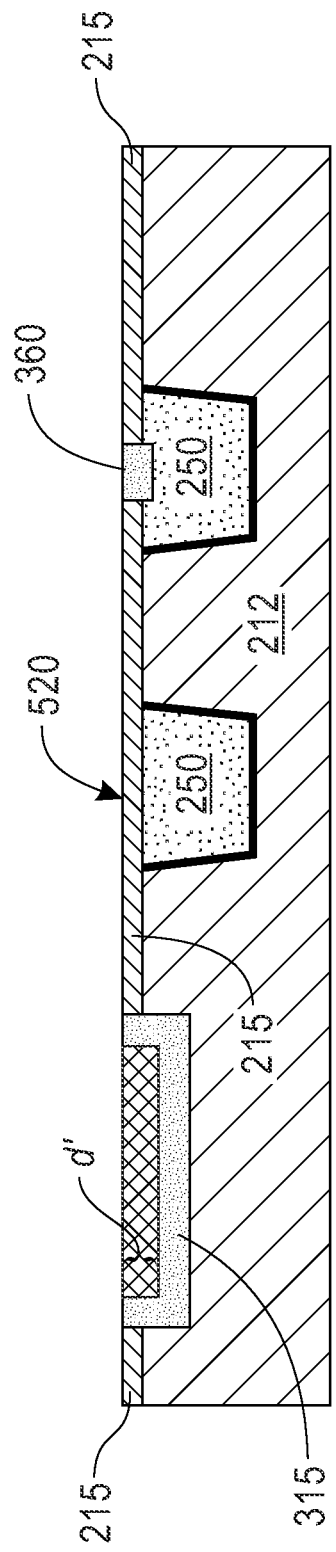

As shown in the cross-sectional view of FIG. 7D, there is depicted a resulting structure formed after performing a plasma etch or like dry etch process to remove the sacrificial OPL layer 612 and the TaN layer 308 in the field areas. In the kerf region 75, the resulting structure includes a bottom metal nitride layer 315, e.g., and a sacrificial OPL material filling that is of a depth "d 40 " within the second opening. In an embodiment, the remaining depth d' within second opening is approximately 35 nm deep. Thus, it is the case that the plasma etch performed results in a SiN layer 215 thickness loss of about 15 nm. As an example of this process, it is assumed an initial thickness of the SiN cap layer 215 is about 50 nm. In an embodiment, OPL removal can be plasma etching with N2H2 based etching chemistry to remove down to the surface which is co-planar with the top surface of SiN cap 215. Then a standard barrier liner CMP can be used to remove bottom electrode 308 with, but not limited to, Silica, Alumina, and Ceria abrasives.

Figure 7E:
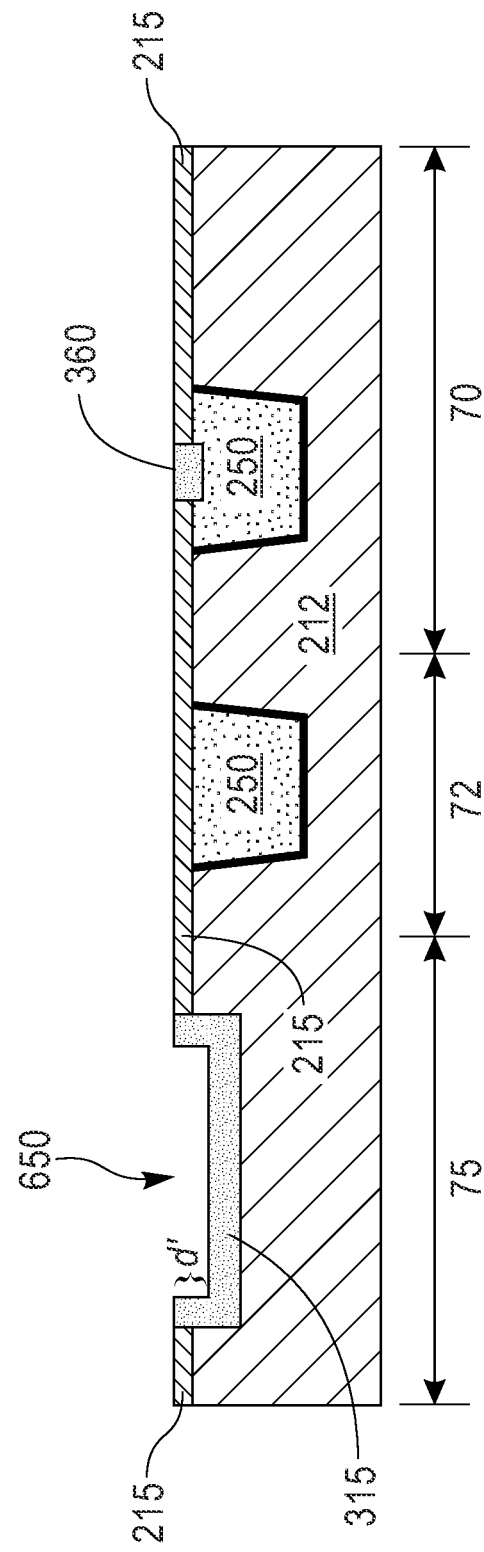

FIG. 7E shows a resulting structure after employing N2H2 based plasma etching process to remove only the sacrificial OPL material without etching and oxidizing the bottom electrode metal material layer 315 (e.g., TaN material) within the second opening in the kerf region 75. This leaves a topography of about a depth d' for use as the overlay/alignment mark feature 650 in the kerf 75.

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed is:

1. A method of manufacturing a semiconducting structure comprising:
   providing a first trench opening in a first area of an interlevel dielectric (ILD) material substrate formed in a semiconductor wafer, said first trench opening corresponding to a bottom electrode feature to be formed for contacting a top surface of a metal conductor wire formed in said ILD material substrate;
   providing a second trench opening in a second area of said ILD material substrate formed in the semiconductor wafer, said second trench opening corresponding to an overlay/alignment mark feature to be formed which is deeper than the first trench opening, both said first and second trench opening formed through a diffusion barrier dielectric cap layer overlying a top surface of said ILD;
   depositing a metal containing material layer for filling said first trench opening to form said bottom electrode to contact the top surface of the metal conductor wire, and said deposited metal containing material layer partially filling the second trench opening;
   depositing a sacrificial material layer above said metal containing material layer, said sacrificial material layer completely filling an unfilled remaining portion of said second trench opening and extending above said second trench opening;
   removing the sacrificial material layer and said metal containing material layer above and between said first trench opening and second trench opening, said sacrificial material layer and metal containing material layers remaining in said second trench opening; and
   removing the sacrificial material layer in said remaining portion of said second trench opening, said partially filled second trench opening providing an overlay/alignment feature topography.

2. The method as claimed in claim 1, wherein said provided overlay/alignment feature topography is formed without any trapped CMP slurry particles.

3. The method as claimed in claim 1, wherein the removing of the sacrificial material and said metal containing material layer comprises one of:
   performing a chemical-mechanical planarization (CMP) process if there is topography over a second opening; or
   performing a plasma etching process to remove the sacrificial material layer above said first opening and second opening if there is no or an insignificant topography over the second opening and then performing the CMP process to remove said metal containing material layer.

4. The method as claimed in claim 1, further comprising one or more of:
   using said overlay/alignment feature topography for lithographic tool detection in a subsequent lithographic process or using said overlay feature topography as an overlay mark for overlay measurement tool detection in a subsequent post-lithography metrology process step.

5. The method as claimed in claim 3,:
   wherein said first area comprises the metal conductor wire having a top surface co-planar with a top surface of said ILD layer;
   said providing said first trench opening comprising etching a first trench through said diffusion barrier layer to expose said top surface of said wire conductor.

6. The method as claimed in claim 5, wherein said providing said second opening comprises:
   etching a second trench through said diffusion barrier dielectric cap layer, said second trench extending into said ILD layer.

7. The method as claimed in claim 5, wherein said CMP processing results in a reducing a thickness of said diffusion barrier dielectric cap layer.

8. The method as claimed in claim 7, wherein said deposited metal containing material layer partially filling the second opening conforms to bottom and sidewall surfaces of said second opening.

9. The method as claimed in claim 8, wherein the final overlay/alignment feature topography created in said the second opening by removing the sacrificial material layer is detectable for alignment by lithography and for overlay measurement on the overlay metrology tool.

10. The method as claimed in claim 1, wherein said sacrificial material is a metal or a metal-nitride material.

11. The method as claimed in claim 1, wherein said sacrificial material is a flowable dielectric material or OPL.

12. A semiconductor structure comprising:
   an interlevel dielectric (ILD) material substrate;
   a metal conductor wire in said ILD material substrate having a top surface co-planar with a top surface of said ILD material substrate;
   a diffusion barrier dielectric cap layer above said top surface of said ILD material substrate and said metal conductor wire top surface;
   an electrode comprising a metal containing material formed above and electrically connected to said metal conductor wire top surface;
   a trench opening extending through said diffusion barrier dielectric cap layer and extending into said ILD material substrate, said trench opening having sidewall and bottom surfaces and having a liner of said metal containing material lining said sidewall and bottom surfaces, wherein said trench opening lined with said metal containing material layer provides an overlay/alignment feature topography without any trapped CMP slurry particles.

13. The semiconductor structure as claimed in claim 12, wherein said metal containing material comprises: a metal nitride material.

14. The semiconductor structure as claimed in claim 12, wherein said trench opening extending through said diffusion barrier dielectric cap layer is located in a kerf area of a semiconductor wafer.

15. A method of manufacturing a semiconducting structure comprising:
   providing an interlevel dielectric (ILD) material substrate, said ILD material substrate including a metal conductor wire having a top surface co-planar with a top surface of said ILD material substrate;
   depositing a diffusion barrier dielectric cap layer above said top surface of said ILD material substrate and said metal conductor wire top surface;
   forming first trench opening through said diffusion barrier dielectric cap layer to expose said top surface of said metal conductor wire;
   forming a second trench opening through said diffusion barrier dielectric cap layer, said second trench opening extending into said ILD material substrate;
   depositing a layer of metal containing material above said diffusion barrier dielectric cap layer, said metal containing material for filling said first trench opening to form a bottom metal electrode contacting said metal conductor wire top surface, said metal containing material lining sidewall surfaces and bottom surface of said second trench opening;
   depositing a sacrificial material layer above said metal containing material layer, said sacrificial material layer completely filling an unfilled remaining portion of said second opening and extending above said second opening;
   removing the sacrificial material layer and the metal containing material layer above and between the first trench opening and second opening, said sacrificial material layer and metal containing material layers remaining in said second opening; and
   removing the sacrificial material layer in said remaining portion of said second opening, said partially filled second opening providing an overlay/alignment feature topography.

16. The method as claimed in claim 15, wherein said provided overlay/alignment feature topography is formed without any trapped CMP slurry particles.

17. The method as claimed in claim 16, wherein said removing the sacrificial material layer and the metal containing material layer comprises one of:
   performing a chemical-mechanical planarization (CMP) process if there is a topography over a second opening; or
   performing a plasma etching to remove overburden of the sacrificial material layer if there is no significant topography over a second opening and then perform a further CMP process to remove the metal containing material layer, said CMP processing results in a reducing a thickness of said diffusion barrier dielectric cap layer.

18. The method as claimed in claim 17, wherein said deposited metal containing material layer forming said bottom metal electrode partially fills the second trench opening.

19. The method as claimed in claim 18, wherein the final overlay/alignment feature topography created in said the second opening by removing the sacrificial material layer is detectable for alignment by lithography and for overlay measurement on the overlay metrology tool.

20. The method as claimed in claim 15, wherein said sacrificial material is one of: a metal, a metal-nitride, a flowable dielectric material, or an OPL.

* * * * *